US006963208B2

(12) United States Patent
Fukasawa et al.

(10) Patent No.: US 6,963,208 B2
(45) Date of Patent: Nov. 8, 2005

(54) PROBE DEVICE, PROBE CARD CHANNEL INFORMATION CREATION PROGRAM, AND PROBE CARD INFORMATION CREATION DEVICE

(75) Inventors: Yukihiko Fukasawa, Nirasaki (JP); Hironobu Abe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/038,026

(22) Filed: Jan. 21, 2005

(65) Prior Publication Data

US 2005/0140380 A1 Jun. 30, 2005

Related U.S. Application Data

(63) Continuation of application No. PCT/JP03/09264, filed on Jul. 22, 2003.

(30) Foreign Application Priority Data

Jul. 22, 2002 (JP) .............................. 2002-212810

(51) Int. Cl.$^7$ ............................................ G01R 31/02
(52) U.S. Cl. .................................. 324/754; 324/158.1
(58) Field of Search ............................... 324/754, 758, 324/765, 73.1, 158.1; 716/4–5

(56) References Cited

U.S. PATENT DOCUMENTS 5,206,582 A * 4/1993 Ekstedt et al. ............. 324/73.1
5,585,737 A 12/1996 Shibata
6,362,013 B1 * 3/2002 Yoshimura ................... 438/14

FOREIGN PATENT DOCUMENTS

JP 7-321167 12/1995

* cited by examiner

*Primary Examiner*—Vinh Nguyen
*Assistant Examiner*—Russell M. Kobert
(74) *Attorney, Agent, or Firm*—Oblon, Spivak, McClelland, Maier & Neustadt, P.C.

(57) ABSTRACT

A probe device includes a supporting member for supporting the probe card having a plurality of channels. Each of the channels has a group of probes which are brought into contact with plural electrode pads of one of objects to be inspected. The probe device further includes a channel information creation unit for creating channel information containing a layout of a group of the plurality of channels and an identification number of each of the channels and transmitting the created channel information to a controller, a channel information memory unit for storing the channel information received from the channel information creation unit, and an object layout memory unit for storing layout information of the objects. The controller performs an inspection of the objects based on the channel information stored in the channel information memory unit and the layout information of the objects stored in the object layout memory unit.

19 Claims, 19 Drawing Sheets

FIG.5A
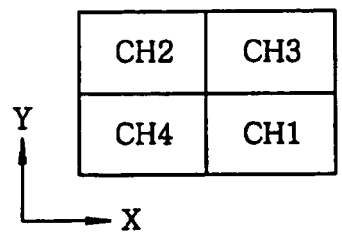
FIG.5B
| NUMBER OF CHANNELS | CH1 | CH2 | CH3 | CH4 |
|---|---|---|---|---|
| 4 | X=0<br>Y=0 | X=−1<br>Y=+1 | X=0<br>Y=+1 | X=−1<br>Y=0 |
FIG.5C
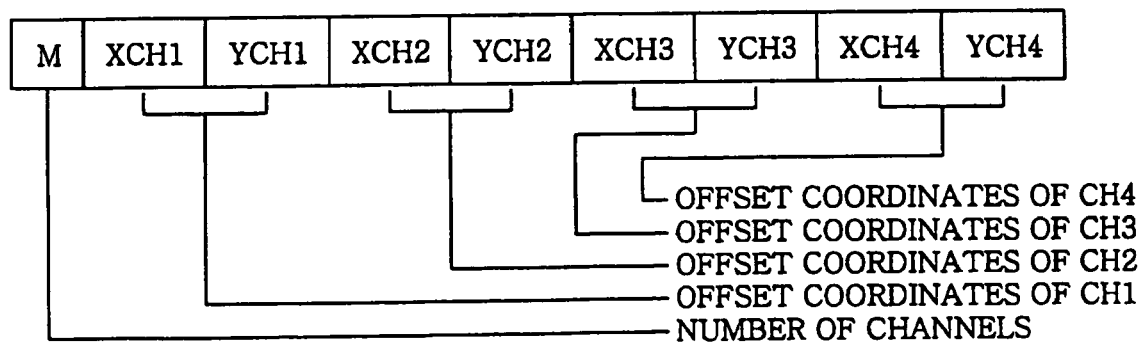

FIG.6A

|     | CH1 | CH2 | CH3 |     |
|-----|-----|-----|-----|-----|
| CH7 | CH4 | CH5 | CH6 | CH8 |

FIG.6B

| NUMBER OF CHANNELS | CH1 | CH2 | ..... | CH7 | CH8 |
|---|---|---|---|---|---|
| 8 | X=0<br>Y=0 | X=+1<br>Y=0 | ..... | X=−1<br>Y=−1 | X=+3<br>Y=−1 |

FIG. 7A
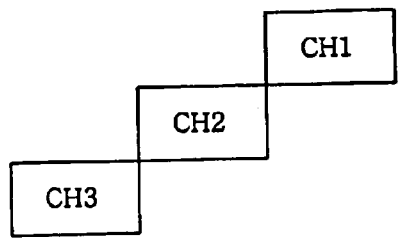
FIG. 7B
| NUMBER OF CHANNELS | CH1 | CH2 | CH3 |
|---|---|---|---|
| 8 | X=0 Y=0 | X=-1 Y=-1 | X=-2 Y=-2 |
FIG. 8A
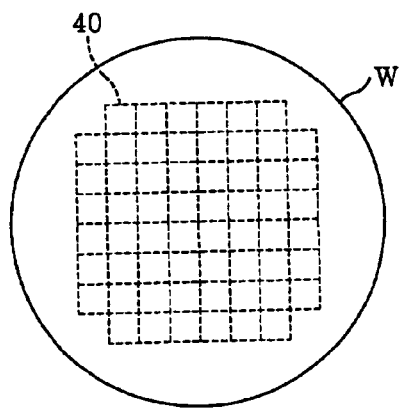
FIG. 8B
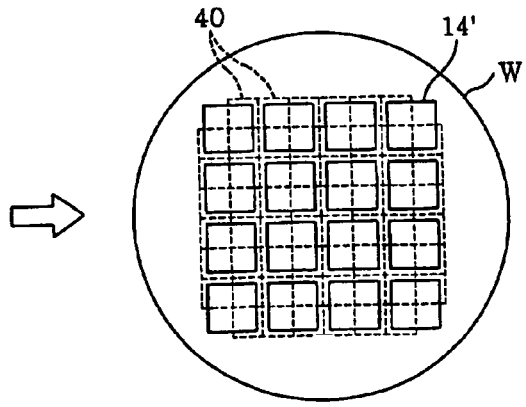

FIG.15

```
┌─────────────────────────────────────────── 300 ───┐
│ ┌─ NUMBER OF CHIPS ─────────────────────────────┐ │
│ │                                               │ │
│ │  MAXIMUM NUMBER OF      ┌───┐  ┌────────────┐ │ │
│ │  CHANNELS IN X DIRECTION│ 0 │  │MULTI-LAYOUT│ │ │
│ │                         └───┘  │  SETTING   │ │ │
│ │  MAXIMUM NUMBER OF      ┌───┐  └────────────┘ │ │
│ │  CHANNELS IN Y DIRECTION│ 0 │                 │ │
│ │                         └───┘                 │ │
│ └───────────────────────────────────────────────┘ │
│ ┌─ CHANNEL ─────────────────────────────────────┐ │
│ │ ┌─ CHANNEL NUMBER SETTING ──────────────────┐ │ │
│ │ │                         ┌───────────────┐ │ │ │
│ │ │ ○ AUTOMATIC  ○ ARBITRARY│ARBITRARY CHANNEL│ │ │
│ │ │                         │    SETTING    │ │ │ │
│ │ │                         └───────────────┘ │ │ │
│ │ └───────────────────────────────────────────┘ │ │
│ │ ┌─ STARTING POINT ──────────────────────────┐ │ │
│ │ │   TOP      BOTTOM     TOP      BOTTOM     │ │ │
│ │ │ ○ LEFT   ○ LEFT     ○ RIGHT  ○ RIGHT      │ │ │
│ │ └───────────────────────────────────────────┘ │ │
│ │ ┌─ DIRECTION ───────────────────────────────┐ │ │
│ │ │ ○ HORIZONTAL  ○ VERTICAL                  │ │ │
│ │ └───────────────────────────────────────────┘ │ │
│ │                           ┌─────┐ ┌────────┐  │ │
│ │                           │ SET │ │ CANCEL │  │ │
│ │                           └─────┘ └────────┘  │ │
│ └───────────────────────────────────────────────┘ │
└───────────────────────────────────────────────────┘
```

FIG.20

| DIRECTION<br>STARTING POINT | HORIZONTAL | VERTICAL |
|---|---|---|
| TOP LEFT | SETTING LEFTMOST COLUMN OF UPPERMOST ROW AS CH1 | SETTING UPPERMOST ROW OF LEFTMOST COLUMN AS CH1 |
| BOTTOM LEFT | SETTING LEFTMOST COLUMN OF LOWERMOST ROW AS CH1 | SETTING LOWERMOST ROW OF LEFTMOST COLUMN AS CH1 |
| TOP RIGHT | SETTING RIGHTMOST COLUMN OF UPPERMOST ROW AS CH1 | SETTING UPPERMOST ROW OF RIGHTMOST COLUMN AS CH1 |
| BOTTOM RIGHT | SETTING RIGHTMOST COLUMN OF LOWERMOST ROW AS CH1 | SETTING LOWERMOST ROW OF RIGHTMOST COLUMN AS CH1 |

FIG.21A

STARTING POINT=TOP LEFT
DIRECTION=HORIZONTAL

|   | 1  | 2  | 3  | 4  |    |
|---|----|----|----|----|----|
| 5 | 6  | 7  | 8  | 9  | 10 |
| 11| 12 | 13 | 14 | 15 | 16 |
|   | 17 | 18 | 19 | 20 |    |

FIG.21B

STARTING POINT=TOP LEFT
DIRECTION=VERTICAL

|   | 3  | 7  | 11 | 15 |    |
|---|----|----|----|----|----|
| 1 | 4  | 8  | 12 | 16 | 19 |
| 2 | 5  | 9  | 13 | 17 | 20 |
|   | 6  | 10 | 14 | 18 |    |

| CHIP SIZE(MICRON) | | WAFER SIZE(INCH) |
|---|---|---|
| X 10000  Y 10000 | | ○4 ○5 ○6 ⊙8 ○12 |

POSITION OF ORIENTATION FLAT
○ 0°  ○ 90°  ⊙ 180°  ○ 270°

SHIFT AMOUNT OF WAFER(MICRON)
X 0   Y 0

KIND OF WAFER
○ ORIENTATION FLAT   ⊙ NOTCH

PRE-SET ADDRESS
X [ ]   Y [ ]

[ SET ]  [ CANCEL ]

FIG.25
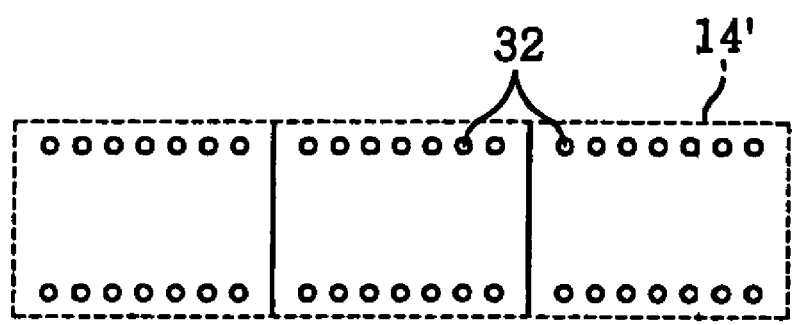
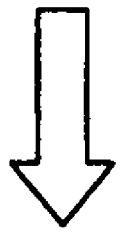
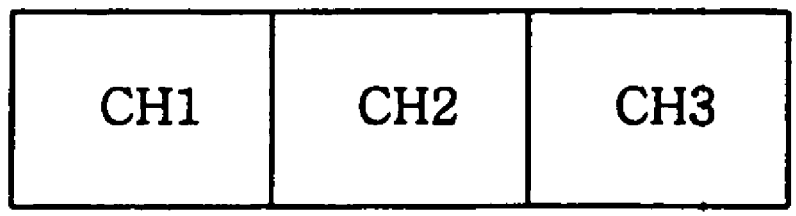

PROBE DEVICE, PROBE CARD CHANNEL INFORMATION CREATION PROGRAM, AND PROBE CARD INFORMATION CREATION DEVICE

This application is a Continuation Application of PCT International Application No. PCT/JP03/09264 filed on Jul. 22, 2003, which designated the United States.

FIELD OF THE INVENTION

The present invention relates to a probe device for inspecting electrical characteristics of an object to be inspected, e.g., a plurality of integrated circuit chips formed on a semiconductor wafer, by using a probe card; and a program for creating channel information of the probe card and a device for creating channel information of the probe card.

BACKGROUND OF THE INVENTION

In a manufacturing process of a semiconductor device, integrated circuit devices are formed on a semiconductor wafer (hereinafter, referred to as a wafer) by a wafer fabrication process, after which a probe test for inspecting electrical characteristics of each integrated circuit device is carried out by a probe device. From the test, it is determined whether or not each IC device formed on the wafer is defective. Afterwards, the wafer is divided into chips, among which non-defective chips are packaged. Hereinafter, the integrated circuit device formed on the wafer is referred to as an IC chip or a chip.

Such probe device includes therein a probe card 3. As shown in FIG. 24, the probe card 3 has a number of probes (e.g., probe needles) 32 and a plurality of contact points 30 electrically connected to the respective probe needles. Each probe needle 32 comes in contact with each electrode pad of the chip 40. A tester (not shown) sends inspection signals to the chips 40 via the probe needles 32 to inspect the electrical characteristics of each chip 40.

Meanwhile, a multi-probe card is used to inspect the electrical characteristics of a plurality of chips at a time. A number of probes of the multi-probe card come in contact with the electrode pads of the plurality of chips simultaneously. A group of probes which are brought into contact with a plurality of electrode pads of a single chip is referred to as a channel. A plurality of channels are provided to a multi-probe card.

For example, FIG. 25 illustrates three channels 14', each of which is enclosed by a dotted line. Circles in each channel 14' represent the probe needles 32. A multiplicity of probe needles 32 makes up the three channels (CH1, CH2 and CH3), as depicted in FIG. 25. Such multi-probe card can be in a contact with three chips at a time. By using such multi-probe card, the frequency of bring the wafer W and the probe card into contact can be reduced, which in turn reduces the inspection time.

Recently, a technique which employs bumps in place of the probe needles has been developed. By using bumps, a layout of the channels (i.e., arrangement pattern of a plurality of channels in the probe card) can be designed with greater degree of freedom. In case of using the probe needles, the channels are usually arranged in a linear fashion. However, when employing the bumps, various layouts of the channels can be adopted, e.g., a pattern with plural lines, an overall rectangular pattern formed by arranging the channels vertically and horizontally and a special pattern, e.g., having a step shaped side.

FIG. 24 schematically illustrates the layout of the chips 40 arranged on the wafer W. In practice, for an optimal usage of the wafer W, the chips in an outer peripheral portion of the wafer W are disposed in a stepped pattern. And the inventors of the present invention directed their attention to reduce the frequency of the contact between the probe card and the chips through research on the layout of the channels of the probe card.

The tester carrying out the inspection of the chips 40 via the channels necessitates matching of respective channels in the probe card with those in the tester. Each channel in the tester is assigned a number and the tester acquires data in a numerical order. The acquired data are written in a memory address corresponding to each number. The tester sequentially transmits measuring signals to the chips via the channels of the probe card and receives response signals from the chips via the channels of the probe card.

For such transmission-reception process, it is necessary to specify the connection relationship between the plurality of the channels of the tester and those of the probe card. For without such specification, the probe device cannot utilize the inspection result received from the tester.

In a conventional probe device, an inspection program is designed according to the type of probe card and, whenever the layout of the channels is modified by an exchange of the probe card, the inspection program needs to be replaced as well. In a standardized method for arranging channel identification ("ID") numbers (numbers assigned to respective channels of the probe card), the identification numbers are sequentially assigned to the respective channels from one end thereof. However, such standardized arrangement of the identification numbers of the channels necessitates the sequence of using signal paths at the tester to be matched with the channel identification numbers of the probe card. In case the channel identification numbers are not assigned in the standardized manner, the inspection program needs to be replaced.

Accordingly, the conventional method requires additional work in modifying the inspection program and causes inconvenience during the inspection, whenever the layout of the channels of the probe card or the arrangement of the identification numbers thereof is altered.

The present invention has been made in view of the above. An object of the present invention is to provide a probe device capable of accommodating a modification in a of channels of a probe card or an arrangement of identification numbers thereof. Further, it is another object of the present invention to provide a program and a device for creating channel information of the probe card capable of enabling the probe device to easily accommodate a modification in the layout of channels of the probe card or the arrangement of the identification numbers thereof.

Other objects and advantages of the present invention will be described in the following description, part of which will become apparent from the disclosure in the description thereof or from implementing the present invention. The objects and advantages of the present invention can be realized by arrangements indicated herein and combination thereof.

In accordance with a first aspect of the invention, there is provided a probe device for inspecting electrical characteristics objects to be inspected by a tester electrically connected to a number of probes of a probe card while the probes are simultaneously in contact with electrode pads of the objects formed on a substrate to be inspected. The probe device includes: a mounting table on which the substrate is mounted; a controller for controlling an operation of the probe device; a supporting member for supporting the probe card containing a plurality of channels, wherein each of the channels has a group of probes which are brought into contact with plural electrode pads of one of the objects; a channel information creation unit for creating channel information including a layout of a group of the plurality of channels and an identification number of each of the channels and transmitting the created channel information to the controller; a channel information memory unit for storing the channel information received from the channel information creation unit; and an object layout memory unit for storing layout information of the objects formed on the substrate, wherein the controller performs an inspection of the substrate at least based on the channel information stored in the channel information memory unit and the layout information of the objects stored in the object layout memory unit.

Preferably, the probe device provided in accordance with the first aspect of the present invention includes one or an appropriate combination of some of the following (a) to (n).

(a) The substrate is a semiconductor wafer and the objects are integrated circuit chips;

(b) Data on channel layout information in the channel information contains one of data in which relative coordinates where each of the channels is located are matched with the identification number thereof and data in which the relative coordinates where each of the channels is located are arranged in a numerical order of identification numbers;

(c) The controller includes at least one of:
a first program, common to plural kinds of probe cards, for controlling a position of the mounting table in order to bring the probes of the probe card into contact with electrode pads of IC chips, based on channel layout information stored in the channel information memory unit and the layout information of the IC chips stored in the object layout memory unit; and
a third program, common to the plural kinds of probe cards, for transmitting to the tester the channel information stored in the channel information memory unit;

(d) A display unit for displaying an image of an arrangement of the IC chips on the substrate to be inspected;

(e) The controller further includes a second program, common to plural kinds of probe cards, for displaying inspection results of the respective IC chips received from the tester over the image of the arrangement of the IC chips displayed on the display unit, based on the channel information stored in the channel information memory unit;

(f) A first imaging unit, movable in X, Y and Z directions, for photographing the tip of a probe;

(g) The controller further includes one of a fourth program for photographing the tip of the probe by the first imaging unit based on channel layout information stored in the channel information memory unit and a fifth program for photographing the tip of the probe by the first imaging unit based on the channel layout information stored in the channel information memory unit, and determining a state of the photographed tip of the probe;

(h) A second imaging unit for photographing contact traces of the probes on the electrode pads of the IC chips is included in the probe device; and the controller further includes one of a sixth program for controlling the position of at least one of the second imaging unit and the mounting table to photograph at least one of the contact traces by the second imaging unit based on the channel information stored in the channel information memory unit and a seventh program for determining whether said at least one of the contact traces is appropriate, in addition to photographing said at least one of the contact traces;

(i) A grinding member is further prepared on the mounting table; and
the controller further includes an eighth program for controlling a position of at least one of the mounting table and the probe card to grind by the grinding member the probes of the probe card, based on the channel layout information stored in the channel information memory unit;

(j) The channel information creation unit is a computer disposed outside of the probe device;

(k) The channel information creation unit includes a unit for inputting the channel information by selecting the image displayed on a display unit;

(l) The channel information creation unit includes a display unit for displaying a set of channels in a matrix form; and a unit for designating channels corresponding to the layout of the channels in the probe card in use among the channels displayed on the display unit;

(m) The channel information creation unit includes a display unit for displaying the layout of the channels of the probe card in use; and a unit for inputting the identification number of each of the channels in the layout of the channels displayed on the display unit; and (n) The channel information creation unit includes at least one of a unit for automatically assigning the identification number to each of the channels; and a unit for arbitrarily assigning the identification number to each of the channels.

In accordance with a second aspect of the invention, there is provided a ninth program used when a plurality of IC chips formed on a substrate to be inspected are inspected by a probe card, wherein the probe card has a multiplicity of channels and each of the channels has a number of probes which are brought into contact with a number of electrode pads of each of the IC chips. The ninth program includes:
a first function of displaying a number of channel areas in a matrix form on a screen of a display unit;
a second function of designating channel areas corresponding to a layout of the channels in the probe card among channel areas displayed in the matrix form;
a third function of displaying the designated channel areas on the display unit;
a fourth function of assigning identification number to a channel corresponding to each designated channel area; and
a fifth function of creation channel information which is a combination of channel layout information and an identification number of each channel.

It is preferable that the program provided in accordance with the second aspect of the present invention includes one or an appropriate combination of some of the following (o) to (t):

(o) The first function includes a unit for displaying on the display unit a plurality of channel areas arranged in an n×m matrix form is used, wherein n and m are the maximum numbers of the channel areas arranged in one probe card horizontally and vertically, respectively;

(p) The second function includes a function of designating a number of channel areas corresponding to the channel layout of the probe card by using a pointing device, among the plurality of channel areas displayed in a matrix form on the display unit;

(q) The fourth function includes at least one of functions of automatically and arbitrarily assigning identification numbers to channel areas sequentially designated among the channel areas displayed on the screen of the display unit;

(r) The first function has a function of displaying on the screen of the display unit channel areas with assigned identification numbers and channel areas without assigned identification numbers, differently;

(s) The channel information includes one of data in which the relative coordinates where each channel is located are matched with the identification number thereof; and data in which the relative coordinates of each channel are arranged in a numerical order of the identification numbers; and (t) A seventh function of selecting an automatic setting mode or an arbitrary setting mode for assigning identification numbers to channels corresponding to the designated channel areas, respectively, wherein in the automatic setting mode, the identification numbers are automatically assigned based on a designation of a channel to be assigned a preset first identification number and a direction of sequentially assigning the identification numbers from that channel, while in the arbitrary setting mode, the identification numbers are arbitrarily assigned to the respective channels corresponding to the channel areas displayed on the screen of the display unit.

In accordance with a third aspect of the present invention, there is provided a device for creating channel information to be used in inspecting electrical characteristics of a plurality of integrated circuits formed on an object to be inspected by using a probe card having a number of channels, wherein each of the channels has probes corresponding to a single integrated circuit and the channel information includes information on each channel. The device for creating the channel information includes: a display unit; a unit for displaying in a matrix form channel areas representing positions of the channels on the display unit; a designating unit for designating channel areas corresponding to a layout of the channels of the probe card, among the channel areas displayed in the matrix form; an input unit for inputting the identification number to a channel corresponding to each of the designated channel areas; and a unit for creating and storing the channel information, based on layout information of designated channels and identification numbers thereof, the channel information being generated by matching the layout information of channels with the channel identification numbers thereof.

Preferably, the device provided in accordance with the third aspect of the present invention includes one or an appropriate combination of some of the following (u) and (v):

(u) The designating unit for designating the channel areas corresponding to the layout of the channels of the probe card is a pointing device; and (v) The input unit for inputting identification numbers includes at least one of input units capable of arbitrarily and automatically assigning the identification numbers to the respective channel areas displayed on the display unit.

BRIEF DESCRIPTION OF THE DRAWINGS

FIGS. 5A to 5C illustrate channel information and a data structure thereof;

FIGS. 6A and 6B represent channel information and a data structure thereof;

FIGS. 7A and 7B illustrate channel information and a data structure thereof;

FIGS. 8A and 8B explain an arrangement of the chips on a wafer and an assignment pattern of the channel contacts of the probe card;

FIG. 15 shows an initial picture displayed on the screen upon the generation of the channel information;

FIG. 20 sets forth parameters when an automatic setting mode is selected for the assignment of the channel identification number;

FIGS. 21A and 21B offer examples of the channel identification numbers assigned in the automatic setting mode;

FIG. 25 is an explanatory view showing a relationship between channels in the conventional probe card and chips.

DETAILED DESCRIPTION OF THE PREFERRED EMBODIMENT

Figure 1:
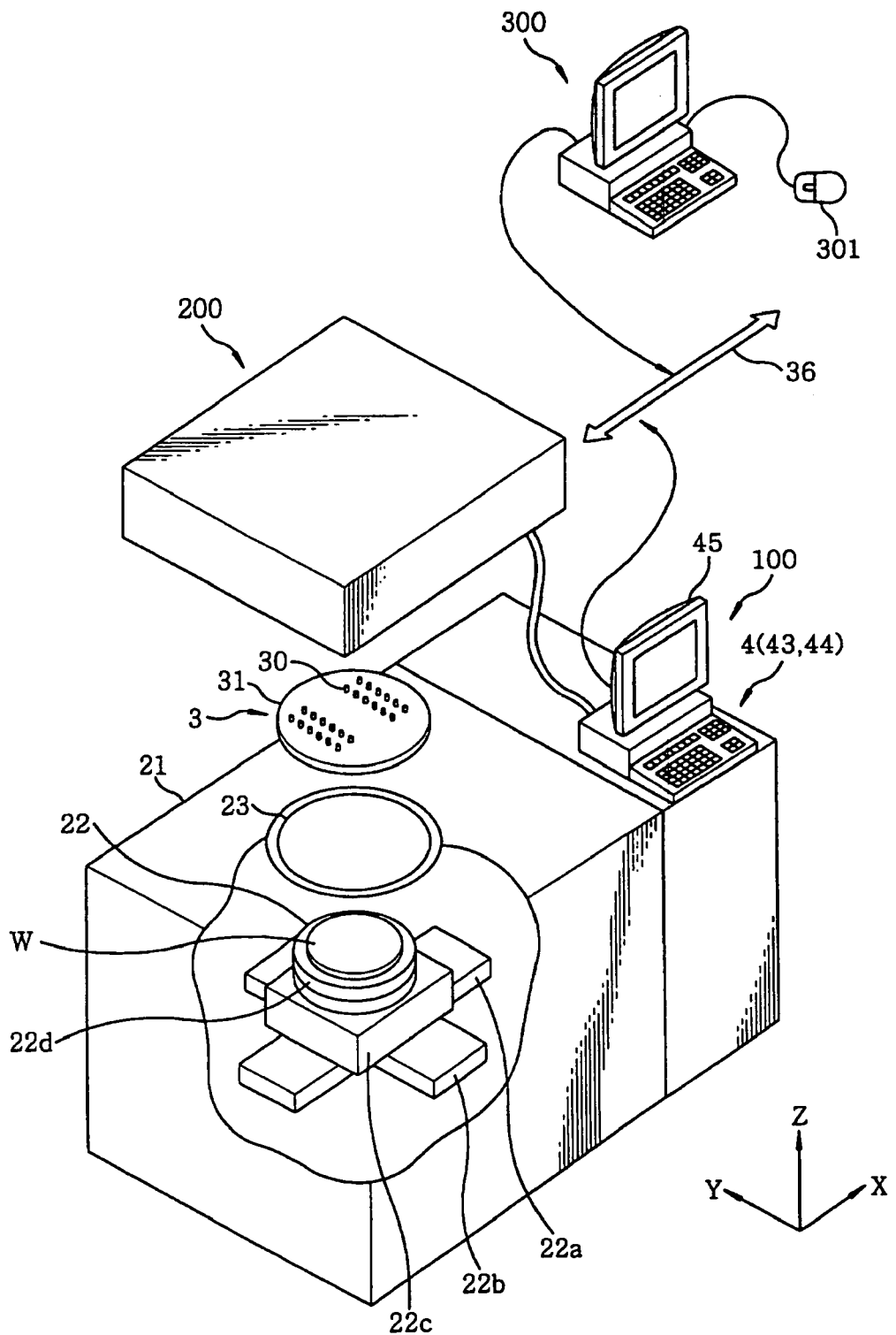
FIG. 1 offers an entire structural view of a probe system incorporating a probe device in accordance with a preferred embodiment of the present invention.

FIG. 1 is a schematic view illustrating a probe system including a probe device and a device for creating channel information of a probe card in accordance with an embodiment of the present invention. In the drawing, reference numerals 100, 200 and 300 represent a probe device, a tester, and a unit for creating channel information of a probe card (hereinafter, referred to as a channel information creation device), respectively. The channel information may include a channel layout and channel identification numbers.

First, the probe system will be described. The channel information creation device 300 generates channel information for each kind of probe card. The generated channel information is sent to the probe device 100 via a communication channel by a third program (transmission program) which is common to plural types of probe cards. The channel information can be stored in a channel information memory unit (hereinafter, referred to as a first memory unit) 43 in a controller 4 of the probe device 100. The controller 4 may include programs common to plural types of probe cards, such as a first program (alignment program) for aligning a wafer probes and a second program (display program) for displaying inspection results from the tester 200. The common programs and channel information allow the probe device 100 to perform various processes based thereon. When a different kind of probe card is used in the probe device 100, the common programs need not be replaced.

Figure 2:
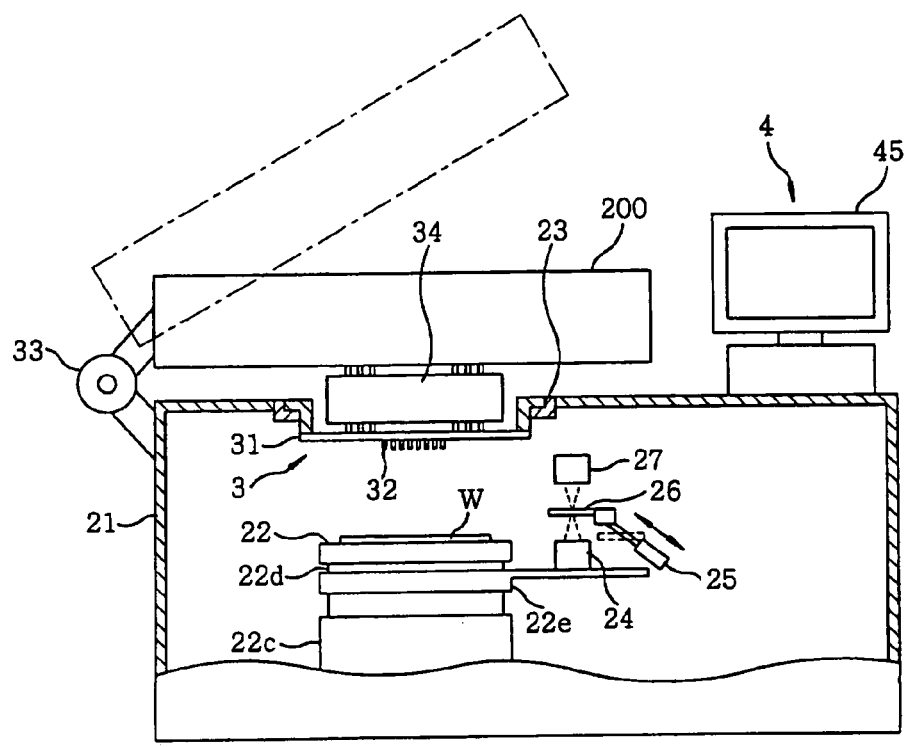
FIG. 2 illustrates a vertical cross sectional side view of the probe device.

The above probe system will now be explained in detail. In FIGS. 1 and 2, a reference numeral 21 represents a casing of the device. A mounting table 22 is provided in the casing 21. The mounting table 22 is movable in X, Y and Z directions by X-, Y- and Z-directional driving unit 22a, 22b and 22c, respectively. Each driving unit includes a ball screw, a guide mechanism and a pulse motor. Further, a θ-directional driving unit 22d rotates the mounting table 22 about its vertical axis.

A supporting member 23 (e.g., a ring member) for supporting the probe card 3 is provided on a top surface of the casing 21. The probe card 3 is horizontally under the ring member 23. The probe card 3 includes a plurality of probes 32 installed on a bottom surface of a probe card main body 31 as shown in FIG. 2. Disposed on a top surface of the card main body 31 are electrodes 30 which are electrically connected to the respective probes 32. Probe needles or bump electrodes such as gold bump electrodes may be used as the probes 32. FIG. 2 shows the probe card with the bump electrodes 32.

Figure 3:
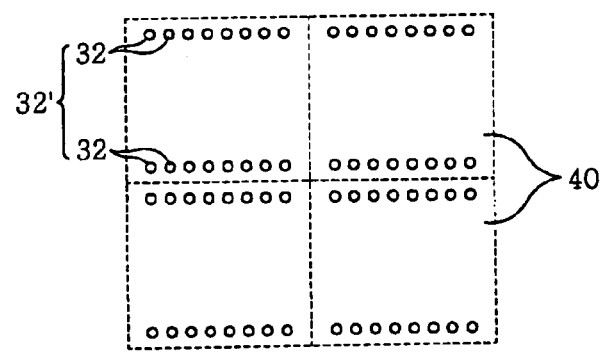
FIG. 3 shows probes of a probe card arranged to correspond to chips on a wafer.

FIG. 3 illustrates with dotted lines a part of objects to be inspected (e.g., IC chips) 40 formed on a substrate to be inspected (e.g., a wafer) W. Circles in the drawing represent probes 32 prepared on a probe card 3, which are arranged to correspond to electrode pads 400 of the chip 40 (see FIG. 11). Each rectangle square indicated by the dotted lines represents one chip 40 having thereon electrode pads. The example shows four chips 40, which are arranged 2 by 2 columnwise and rowwise. The probes 32 are aligned to correspond to the electrode pads of the respective chips 40. In the present embodiment, probe groups (hereinafter, referred to as "channels") 32', each group being made up of a plurality of probes corresponding to a single chip 40, are arranged 2 by 2 columnwise and rowwise.

FIG. 2 shows in detail a mechanism related to the mounting table 22. An elevator unit 22e is moved up and down by the Z-directional driving unit 22c. A first imaging unit 24 and a target 26 can be provided on the elevator unit 22e. The target 26 is moved forward and backward by a reciprocating mechanism 25 in a direction intersecting an optical axis of the first imaging unit 24. A second imaging unit 27 capable of making a horizontal motion can be prepared between the mounting table 22 and the probe card 3. CCD cameras or optical systems may serve as such imaging units 24 and 27.

The tester 200 can be disposed above the casing 21. The tester 200 sends inspection signals to the chips 40 on the wafer W, and receives signals of measurement results from the chips 40 via the probe card 3. Based on the received data signals of measurement results, the tester 200 measures electrical characteristics of each chip 40 to thereby determine pass/failure thereof. The tester 200 can be rotatably supported by a hinge 33 about the horizontal axis thereof above the casing 21. A contact ring 34 can be disposed between the probe card 3 and the tester 200 is. The contact ring 34 connects the electrodes 30 on the top surface of the probe card 3 (see FIG. 1) to the electrodes of the tester 200.

On the casing 21, there can be provided the controller 4 (e.g., a computer) which enables an operator to set operation conditions or control conditions of the device.

Figure 4:
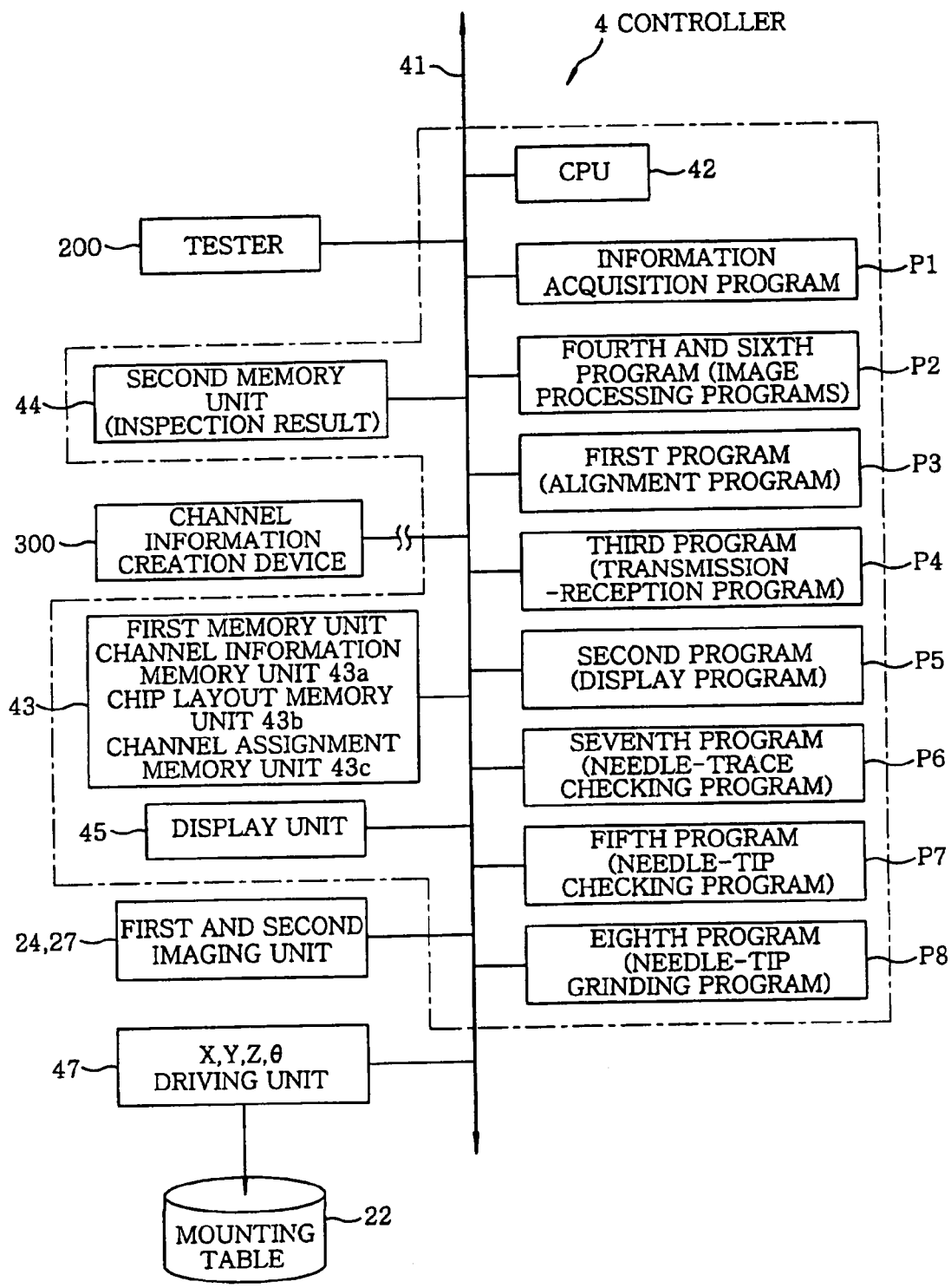
FIG. 4 is a block diagram of an example of a controller provided in the probe device.

FIG. 4 illustrates a configuration of the controller 4. Reference numerals 41 and 42 are a bus and a CPU (central processing unit), respectively. A first memory unit 43 can serve as a channel information memory unit for storing the channel information of the probe card 3. Further, the first memory unit 43 can function as a layout memory unit of objects (chips) to be inspected to store the layout of the chips 40 formed on the wafer W. Moreover, the first memory unit 43 may include a channel assignment memory unit 43c for storing a channel assignment pattern of a group of chips 40 to be described later. A second memory unit (memory) 44 stores inspection results of each chip 40 received from the tester 200, and reference numeral 45 is a display unit (e.g., a liquid crystal panel). Each program is illustrated as a block for the sake of convenience. In the present embodiment, the first memory unit 43 includes a channel information memory unit 43a for storing the channel information and a chip layout memory unit 43b for storing the layout of the chips.

The channel information includes the information on the channel layout identification numbers. The channel layout is information regarding the arrangement of a plurality of channels and can be the information specifying the relative positioning of the plurality of channels. The layout of the channels illustrated in FIG. 3 is of a rectangular shape, wherein the channels are arranged in two rows each having two channels (two rows arranged in Y direction and each row having two channels arranged in X direction).

The channel identification numbers are used to specify data when transmitting and receiving the data between the tester 200 and the probe device 100. During the inspection of the chips 40 via each channel, the tester 200 transmits and receives the inspection signal based on the identification number of each channel. Each channel of the probe card 3 is assigned an identification number, thereby allowing the tester 200 to specify the relationship between the channels of the tester 200 and those of the probe card 3. For example, channel 1 of the tester 200 transmits and receives signals to and from channel 1 of the probe card 3.

An example in FIG. 5A illustrates four channels, where number 1 is assigned to a bottom right; number 2, to a top left channel; number 3, to a top right channel; and number 4, to a bottom left channel. The channels 1 to 4 are represented as CH1 to CH4.

Channel information data shown in FIG. 5B can be arranged as offset coordinates (relative coordinates) of the channels in a predetermined array. Further, the offset coordinates (relative coordinates) of the channels can also be arranged in the order of the identification numbers. In the offset coordinates of the present embodiment, the coordinates of the channel CH1 are represented by X=0 and Y=0, and the positions of the X and Y coordinates of the other channels CH2 to CH4 are expressed by assigning ⌈+⌋ when offset in the positive X or Y directions, while assigning ⌈−⌋ when offset in the negative X or Y directions. In the example, the total number of channels (multi-number) prepared in the probe card 3 is disposed at the beginning of the data and is followed by the offset coordinates of the channels in the order starting from the channel CH1. More specifically, the channel information is written in the first memory unit 43 in the order of the total number of channels, an offset X coordinate of channel CH1, an offset Y coordinate of channel CH1, . . . , and an offset Y coordinate of channel CH4, as 16-bit data each, as shown in FIG. 5C.

By such configuration of the channel information, the channel layout and channel identification numbers of the channels can be organized into an arbitrary and simple data structure. For example, even for the layouts shown in FIGS. 6A and 7A, channel information can be set easily.

The layout (wafer map) of the chips 40 is a pattern of the arrangement of the chips on a wafer W. A position of each chip thereon can be specified by, e.g., the relative coordinates with respect to the center of the wafer W. Moreover, the assignment pattern of the channels to a group of a plurality of chips 40 on the wafer W refers to a sequence of bringing a plurality of channels formed in according to a predetermined layout on the probe card 3 into contact with the group of the plurality of chips 40. FIG. 8 shows schematically an example thereof. FIG. 8A illustrates the layout of the chips 40 formed on the wafer W. Further, FIG. 8B illustrates a state in which the channels are assigned to the chips. In FIG. 8B, a rectangle drawn by solid lines represents a channel group made up of the four channels, CH1 to CH4 prepared on one probe card 3. A channel group can be in contact with the plurality of chips at a time.

In the present embodiment, the channel information, the layout and the channel assignment information of the chips 40 can be set by the channel information creation unit (e.g., an external computer) 300. The created channel information can be stored in the first memory unit 43 of the controller 4 via a communications cable 46 (e.g., a LAN cable). Further, the information such as the channel information created by the channel information creation device 300 may be inputted into the probe device 100 by means of contactless communications (e.g., infrared communications) or a memory medium such as a flexible disk. A ⌈channel information input unit for inputting the channel information into the controller⌋ and a ⌈chip layout input unit for inputting the layout of the chips formed on the wafer⌋ in accordance with the present invention can be a communications hardware or program prepared in the probe device 100 in case of employing the LAN cable 46 or a data acquisition equipment, such as a flexible disk drive, or a data reading program in case of employing memory medium.

Furthermore, the controller 4 may include various programs common to different types of probe cards. Preferring to FIG. 4, an information acquisition program P1 is for writing the information into the first memory unit 43 of the probe device 100 via the LAN cable 46. A fourth and a sixth program (image processing programs) P2 are for processing the image data taken by the first imaging unit 24 and the second imaging unit 27. A first program (alignment program) P3 is for aligning the wafer W with the probe card 3. The alignment program can align the wafer W and the probe card 3 based on the positions of the probes 32 given by the image data, the position of the chips 40 on the wafer W, the channel information, the layout of the chips 40 (wafer map) and the assignment pattern of the channels to the group of chips 40.

A third program (transmission-reception program) P4 is for sending the tester 200 the channel information stored in the first memory unit 43 and writing the inspection result of each chip 40 from the tester 200 in the second memory unit 44, every time when the probes 32 come in contact with the wafer W (for example, whenever four channels CH1 to CH4 are in contact with four chips 40). A second program (display program) P5 is for showing on the display unit 45 the image of the arrangement of the chips 40 on the wafer W. It is preferable that the display program P5 is configured to be commonly used in plural kinds of probe cards. Further, the program P5 also displays the inspection result (pass/failure) of the chips 40 received from the tester 200 in such a manner that the results are superimposed on the image of the arrangement of the chips 40.

A seventh program P6, a fifth program P7 and an eighth program P8 are those used when the probe needles are used as the probes 32. That is, these programs are a needle-trace checking program for examining traces of the probe needles formed on the electrode pads of the chips 40, a needle-tip checking program for checking the tips of the probe needle and a needle-tip grinding program for polishing the tips of the probe needles. These programs P1 to P8 can be stored in the memory unit 43 or 44 of the controller 4 or another memory unit (not shown). In FIG. 4, a reference numeral 47 indicates all the driving units 22a to 22d for moving the mounting table 22.

Hereinafter, an operation of the above-described probe system will be described. First, the channel information creation device 300 creates channel information of the probe card 3 in use, a layout of the chips 40 (wafer map) and an assignment pattern of the channels to the group of the chips 40. The created information is sent to the probe device 100 by a transmission program. The transmitted information is written in the first memory unit 43 of the probe device 100 via the LAN cable 46 by the information acquisition program P1. Creation of the channel information will be described later.

The transmission-reception program P4 transmits the channel information to the tester 200. When the channel information is transmitted from the channel information creation device 300 to the probe device 100 and from the probe device 100 to the tester 200, communications data may take the data structure shown in FIG. 5C. An operator manipulates the controller 4 to mount on the mounting table 22 the wafer W drawn out from the wafer carrier (not shown) by an arm. Subsequently, a series of aligning processes are performed by the alignment program P3.

Figure 9A:
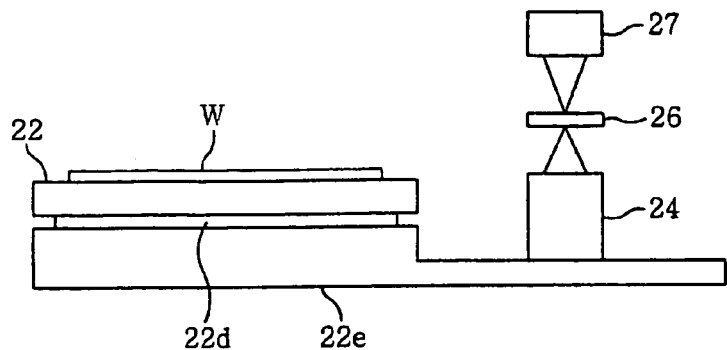
FIGS. 9A to 9C depict a first and a second imaging unit capturing the images of the chips and the probes.
Figure 9B:
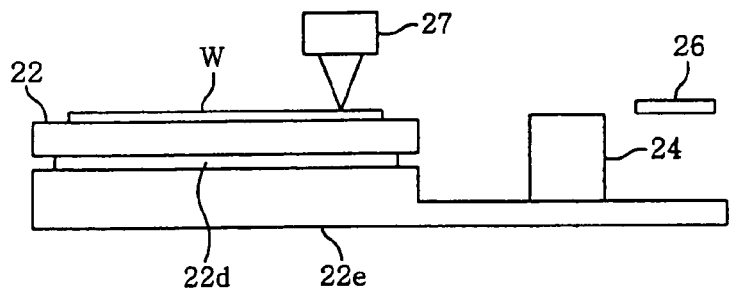

An exemplary alignment method will now be explained. As shown in FIG. 9A, the first imaging unit 24 is preset to be focused on the target 26. The X-, Y- and Z-directional driving units 22a to 22c (see FIG. 1) moves the mounting table 22, thereby placing the target 26 on the focus of the second imaging unit 27. The imaging units capture images of the wafer W and the probes 32 to detect positions thereof with reference to the position of the mounting table 22 at that moment.

Figure 9C:
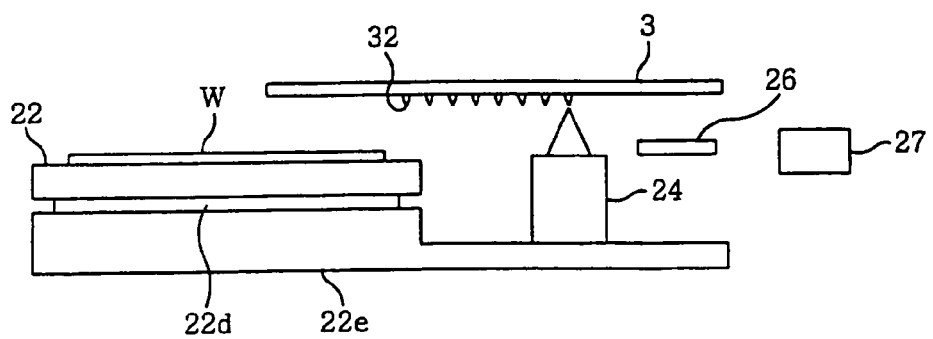

Afterwards, the second imaging unit 27 captures the images of feature points on the wafer W (e.g., the central point and four points equi-distanced around the circumference of the wafer W). Based on the data obtained by the above, the position (position of X, Y and Z coordinates) of each chip 40 on the wafer W is obtained precisely. As shown in FIG. 9C, the first imaging unit 24 captures the images of the probes 32 of the probe card 3, thereby precisely obtaining the positions thereof (positions of X, Y and Z coordinates).

An exemplary method for obtaining the positions of the probes 32 will now be described. A position of a target mark prepared in the probe card 3 is detected by capturing an image thereof, wherein the target mark corresponds to the probe 32 located at a left end of the first row. A position of each channel is roughly estimated based on the position of the target mark and the channel information stored in the first memory unit 43. The first imaging unit 24 captures an image of each channel and a position of each of the channels CH1 to CH4 is precisely obtained based on the images captured. The wafer W is loaded on the mounting table 22 after being aligned. As a result, the arrangement of the channels of the probe card 3 is roughly matched with that of the chips 40 of the wafer W. By rotating the mounting table 22 according to the images captured, the chips 40 coincide with arrangement direction of the channels of the probe card.

Figure 10:
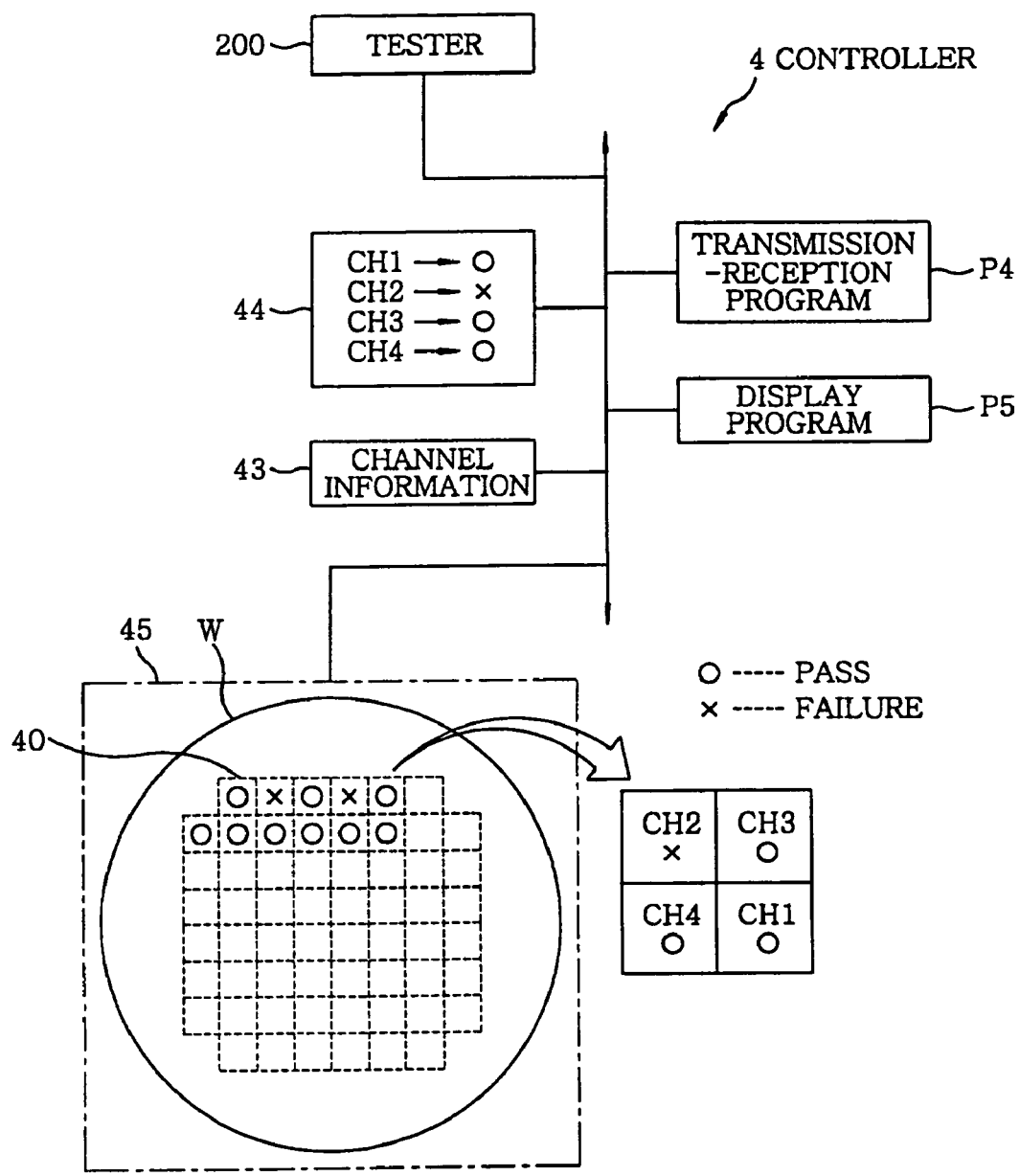
FIG. 10 is an explanatory view displaying inspection results over an image of the chip arrangement displayed on the screen.

As described above, the assignment of the channels CH1 to CH4 to the chip arrangement (see FIG. 8B) is preset. After finding the exact positions of each chip 40 and each of the channels CH1 to CH4, the driving unit 47 moves the mounting table 22 in order to bring the channels CH1 to CH4 of the probes 32 into contact with a plurality of chips 40 with high precision. The channel information has already been forwarded to the tester 200. While the chips 40 are in contact with the channels CH1 to CH4, the tester 200 sequentially transmits the inspection signals to the four channels CH1 to CH4. Afterwards, response signals are sent to the tester 200 from the chips 40. The tester 200 determines the pass/failure of the chips 40 based on the response signals, and forwards the inspection results of the channels CH1 to CH4 to the controller 4. The inspection results are stored in the second memory unit 44 in the probe device 100, as illustrated in FIG. 10.

By the display program P5, the inspection results stored in the second memory unit 44 are displayed to overlap the image of the arrangement of the chips on the display unit 45. In order to display the inspection results of the chips as described above, the controller 4 obtains the positions of the four channels CH1 to CH4, i.e., the positions on the image of the arrangement of the chips, by referring to the channel information stored in the first memory unit 43, and indicates the inspection results at the obtained positions. FIG. 10 shows the pass/failure of the four chips 40 at the third contact of the channels with the chips. The pass/failure of the chips 40 may be displayed by using different display colors for a good chip 40 and a defective chip 40.

In the present embodiment, after coming into contact with the chips disposed in the first and second rows, the four channels are brought into contact with the chips in the third and fourth rows. However, in a case of the four channels being in contact with the chips in the second and third rows, the measured areas are overlapped, in which case a single chip comes into contact with the channel twice. The channel information creation device 300 can determine which contact is to be used for the inspection of the electrical characteristics of the chips 40 and send the information therefor to the first memory unit 43.

The channel information in the first memory unit 43 can also be in the following processing. In case of using the probe needles as probes 32, the probe traces remaining on the electrode pads of the last inspected chip are examined upon completion of the inspection of a predetermined number of chips. This examination is executed by using the needle-trace checking program P6. The needle-trace checking program P6 may include a sixth program for allowing the second imaging unit 27 to photograph at least one contact trace by adjusting the position of at least one of the second imaging unit 27 and the mounting table 22, based on the channel information stored in the corresponding channel information memory unit 43a. Additionally or alternatively, the needle-trace checking program P6 can include a seventh program for photographing at least one contact trace to determine whether the contact trace is appropriate. The examination can be performed by photographing the second imaging unit 27, the electrode pads of the four chips preselected from a number of chips allotted as shown in FIG. 8B.

Figure 11:
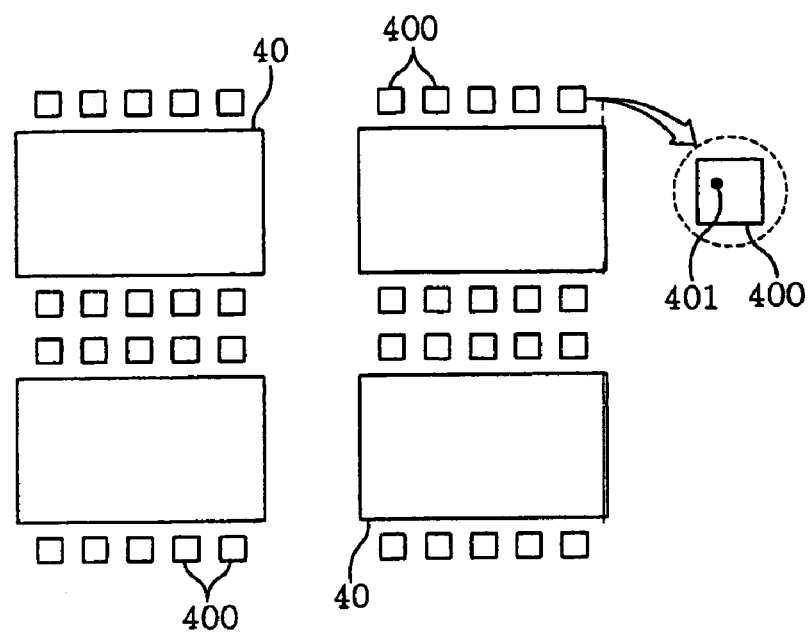
FIG. 11 offers a top view showing a trace of probe needle of a chip being examined.

FIG. 11 illustrates the four chips chosen among a group of chips 40. The drawing also shows the electrode pads 400. The needle trace 401 on each electrode pad 400 can be observed. Based on the observation results and the channel information in the first memory unit 43, it is determined whether each channel is properly in contact with the chip. For example, as provided in the enlarged view encircled with the dotted line in FIG. 11, the position of needle trace 401 can be checked. When the needle trace is disposed away from the center of the electrode pad 400 by a predetermined distance, the identification number (CH1 to CH4) of the channel which was in contact with that electrode pad 400 can be found. Further, it is also possible to specify the chips 40 inspected by that channel and reinspect the chips 40. Moreover, the used probe card 3 may be replaced with a new one.

Upon completion of the inspection of the predetermined number of wafers or chips, the states of the tips of the probes 32 can be examined by the needle-tip checking program P7. The program P7 can include a fourth program which directs the first imaging unit 24 to photograph the tips of the probes, based on the layout of the channels stored in the channel information memory unit 43a. Additionally or alternatively, the program P7 may further include a fifth program for photographing the tips of the probes by the first imaging unit 24 to determine the states of the photographed tips of the probes based on the layout of the channels stored in the channel information memory unit 43a.

The state of the tip of the probe can be observed by using the first imaging unit 24. Based on the observation result and the channel information in the first memory unit 43, the state of each channel can be determined whether it is good or bad. In such a case, the chip inspected by the defective channel may be reinspected.

When probe needles are employed as the probes 32, the tips of needles may be ground by the needle-tip grinding program P8 after completing the inspection of a predetermined number of wafers. Specifically, the tips of needles may be pushed against a grinder (e.g., grinding plate) mounted on the mounting table 22 and then ground by moving the mounting table 22. Moreover, the tips of needles can also be ground by thrusting the probes 32 against the grinder (e.g., grinding plate).

Figure 12:
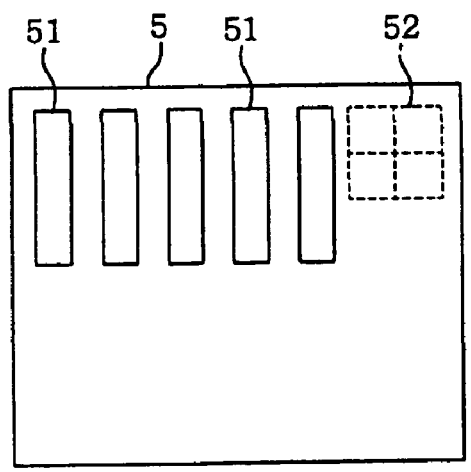
FIG. 12 shows a surface of a grinder for grinding tips of the probe needles, and grinding areas.

FIG. 12 shows a surface of a grinding plate 5. Reference numeral 51 indicates fully used up areas on which grinding the probe 32 was carried out. The needle-tip grinding program P8 can recognize the coordinates of the fully used up areas 51 in the grinding plate 5 based on, e.g., the information stored in the memory provided in the controller 4. The controller 4 can determine a not fully used up area of the grinding plate 5 to be used for grinding the needle tips of the four channels CH1 to CH4 (represented by 52 in FIG. 12 for convenience) based on the channel information in the first memory unit 43. The controller 4 moves the mounting table 22 so that the channels CH1 to CH4 may be ground in the designated area.

The aforementioned probe device has various programs (e.g., alignment program P3) which can be commonly used for different kinds of probe cards 3. Further, the probe device acquires the channel information such as the layout and identification numbers of the channels of the probe card 3 from an external channel information creation device 300. Therefore, by overwriting the channel information, the series of common programs (e.g., programs P3 to P8) can be used without being changed even when using a new probe card 3 which differs at least in the channel layout or channel identification numbers. As a result, the inspections can be expedited. Moreover, there is no need to prepare a different program for each kind of probe card 3, thereby saving labor in programming and time for managing the program.

Furthermore, by way of arranging the channel information in numerical order of identification numbers and managing the positions of the channels as the offset coordinate (relative coordinate) data as shown in FIG. 5B, the layout and the identification numbers of the channels can be represented by an arbitrary and simple data structure. Therefore, arbitrary layout and identification numbers can be represented conveniently. Further, each program is compatible with various kinds of probe cards 3 each of which has different channel information since each program can easily recognize the contents of the channel information.

Figure 13:
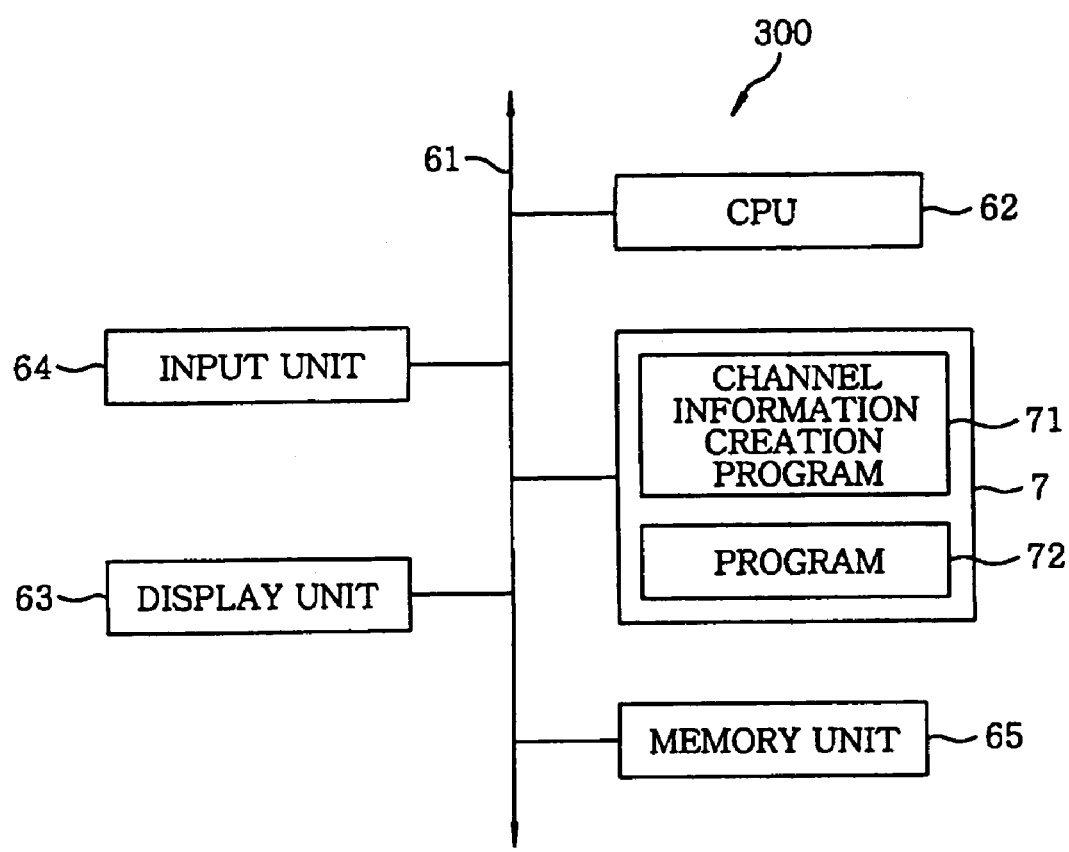
FIG. 13 provides a block diagram of a control system used in a channel information creation device in accordance with an embodiment of the present invention.

Preferred embodiments of the probe card's channel information creation device 300 provided in FIG. 1 and the channel information creation program employed therein will be explained in detail. A computer, e.g., a personal computer, may be used as the channel information creation device 300. FIG. 13 shows a configuration of control system. A reference numeral 61 represents a bus; 62, a CPU; 63, a display unit, e.g., LCD screen or the like; and 64, an input unit including a keyboard and a pointing device (a mouse 301). Further, a reference numeral 7 represents a memory unit (program memory), in which a channel information creation program 71 and a program 72 for executing a display of the arrangement of the chips can be stored. The channel information and the like created by the programs 71 and 72 are stored in a memory unit 65.

Figure 14:
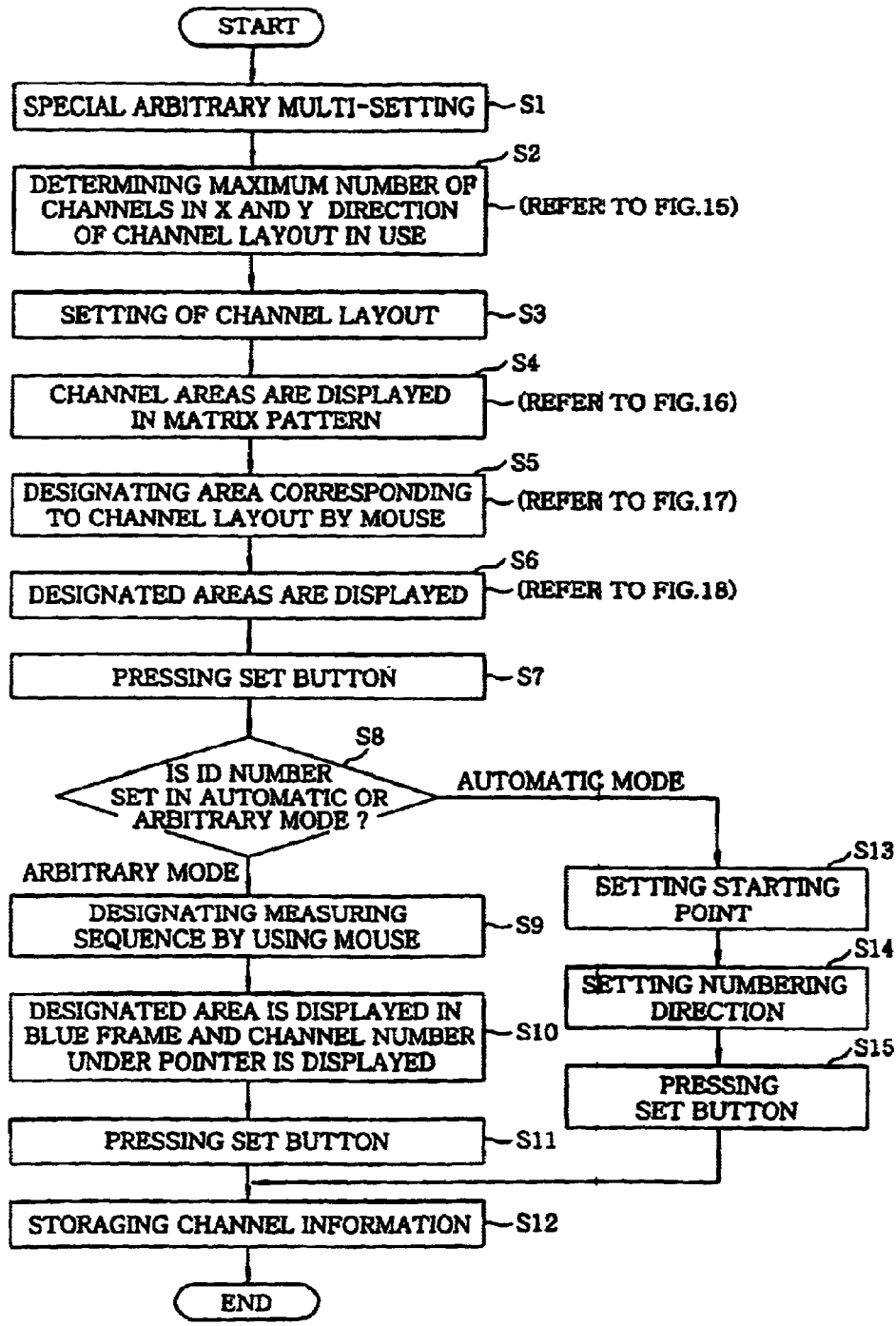
FIG. 14 is a flow chart illustrating processing steps of the channel information creation device using a channel information creation program in accordance with an embodiment of the present invention.

Steps of creating the channel information by the channel information creation device 300 will now be explained with reference to FIG. 14. The steps are carried out by a ninth program which is used when a plurality of IC chips formed on a substrate are inspected by the probe card.

Figure 16:
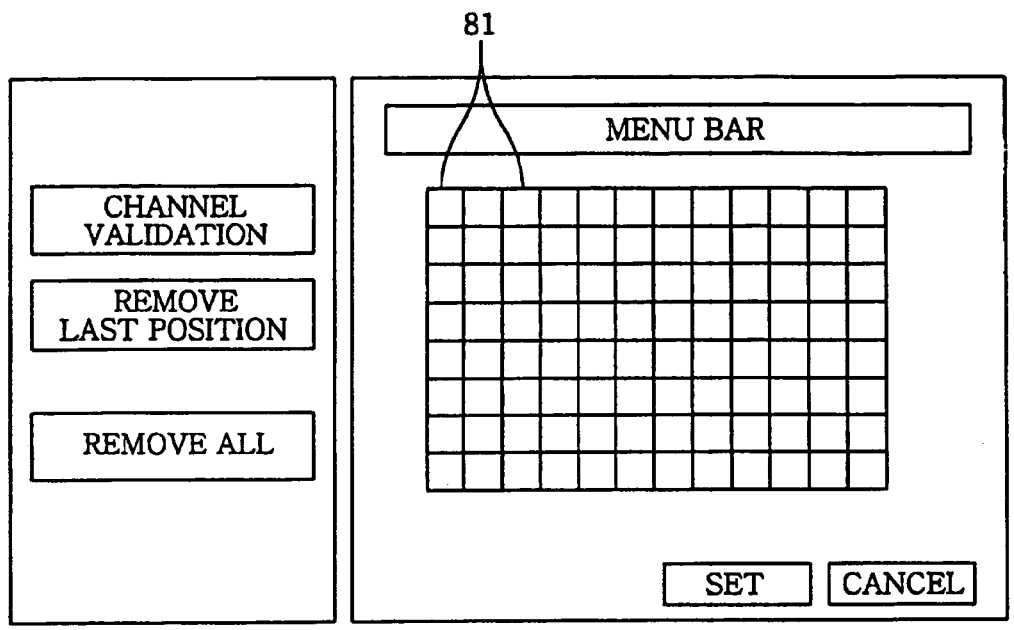
FIG. 16 illustrates a screen displaying thereon channel areas arranged in a matrix form.

First, a "special arbitrary multi-setting" button is selected on a screen of the display unit 63 (step S1). Then, a picture shown in FIG. 15 appears on the screen. In the picture, the maximum number of channels in X and Y directions are set depending on the type of probe card employed. Herein, X=12, Y=8 are inputted (step S2). Afterwards, the "multi-layout setting" button is pressed (step S3). By this, channel areas 81 are displayed in a matrix form, as shown in FIG. 16 (step S4). Here, the channel areas 81 are indicated by squares disposed in the matrix form. Each square corresponds to one channel. Accordingly, by designating the squares in conforming with the predetermined layout (arrangement pattern), the information on the layout of the channels can be created.

The above-mentioned steps S1 to S4 are specific examples of a first function of the ninth program. In this case, a matrix of 12×8 squares is illustrated. Further, the expression "the channel area 81 is arranged in a matrix form" includes, e.g., a single vertical array of channel areas 81 formed by setting X=1 and a single horizontal array of channel areas 81 formed by setting Y=1.

Figure 17:
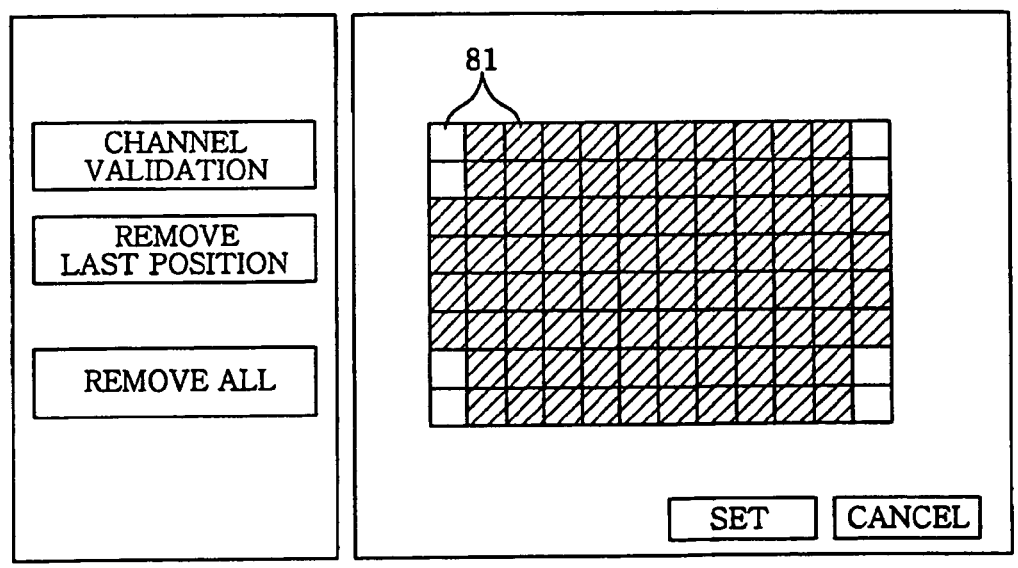
FIG. 17 is an explanatory view showing a screen displaying thereon a layout of the channels designated by using the channel areas arranged in the matrix form.

The channel areas 81 corresponding to the predetermined channel layout are designated among a plurality of channel areas 81 illustrated in matrix form as shown in FIG. 17, through the use of the input unit (e.g., a pointing device) 64 (FIG. 13) (step S5), wherein step S5 is a specific example of a second function of the ninth program.

The designated channel areas 81 and the non-designated channel areas are displayed differently (step S6), wherein step S6 is an example of a third function of the ninth program.

By clicking on a "channel validation" button the designated channel areas become effective. A "remove last position" button can be pressed to cancel the channel area 81 designated immediately before pressing the button. If a "remove all" button is pressed, all selected areas are initialized. Pressing the "channel validation" button and a "set" button (step S7) after designating the channel areas 81 returns the screen to the state shown in FIG. 15.

Next, channel identification numbers are assigned. The channel information creation program 71 (FIG. 13) has an automatic setting mode and an arbitrary setting mode. In the automatic setting mode, the identification numbers are automatically assigned to the channels, based on a designation of a channel to be assigned a preset first identification number and a direction of sequentially assigning the identification numbers from that channel, whereas in the arbitrary setting mode, the identification numbers are assigned arbitrarily to the respective channels corresponding to the plural channel areas displayed on the screen.

Figure 18:
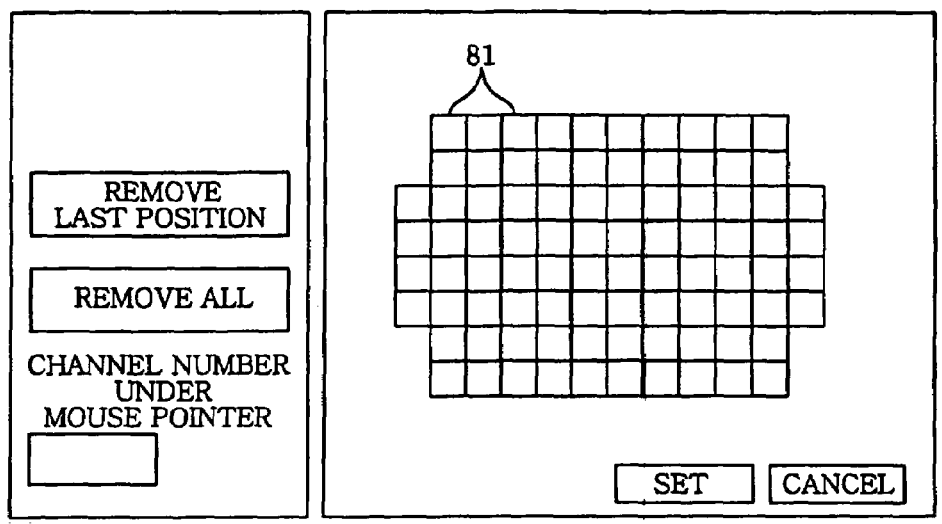
FIG. 18 depicts a screen displaying the channel areas corresponding to the designated channel layout.
Figure 19:
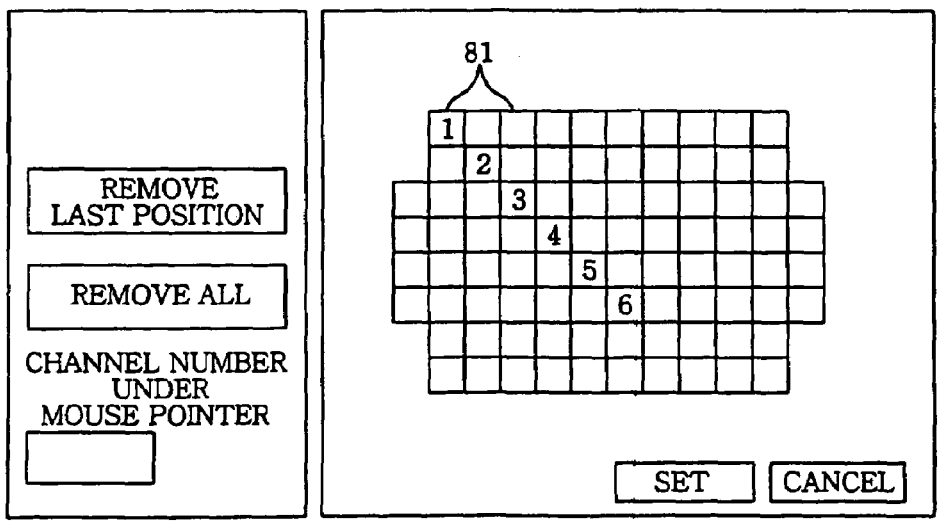
FIG. 19 illustrates a screen displaying a manner wherein identification numbers are assigned to respective channel areas.

An operator makes a selection through the screen of FIG. 15 (step S8). By selecting the arbitrary setting mode and clicking on a "arbitrary channel setting" button, the layout of the previously designated channel areas 81 is displayed as shown in FIG. 18. Among the designated channel areas 81, channel areas 81 are sequentially assigned channel identification numbers in numerical order of selecting the channels areas 81. The identification numbers are inputted by sequentially selecting the channel areas 81 starting from a channel corresponding to corresponding to the identification number 1, through the use of, e.g., the pointing device (step S9). Steps S8 and S9 are specific examples of a fourth function of the ninth program. During such processes, the designated areas 81 are color-coded to be differentiated from the non-designated ones. For example, the designated channel area is displayed in a blue frame. Further, the channel number of a channel area 81 pointed by the pointing device is indicated in "channel number under mouse pointing device" field located in a bottom left region of the screen (step S10). Therefore, if the No. 1 channel area 81 is selected by the mouse pointing device, e.g., after designating up to $6^{th}$ channel area, "1" is displayed in the above field. FIG. 19 illustrates a state in which six channel areas are sequentially selected diagonally from the channel area in the upper left corner of the layout to bottom right corner. In this case, the channel numbers are not indicated in the respective channel areas 81. However, the channel numbers may be indicated in the channel areas 81 in the order of selecting the channel areas 81.

After assigning the channel numbers to all channels, the "set" button is pressed to effectuate the setting (step S11), wherein step S11 is a specific example of a fifth function of the ninth program. The identification numbers assigned through the above steps are matched with the preset layout of the channels and are then stored as the channel information in a memory. By selecting "file" of "menu bar" and then selecting "save", the channel information is stored in the memory unit 65 of a storage location (step S12). The memory unit 65 illustrated in FIG. 13 can be, e.g., a hard disk, a flexible disk or the like. If the "remove last position" button (FIG. 19) is pressed, the last assigned channel number is cancelled. By clicking on the "remove all" button, all channel numbers are cancelled.

The case of selecting the automatic setting mode on the screen after step S8 shown in FIG. 15 will be explained in detail. By setting a "starting point" (step S13) and a "direction" (step S14) on the screen, the identification numbers (numbers) are assigned automatically in a regulated manner. The "starting point" is one of the channel areas 81 shown in FIG. 18, which corresponds to the first channel. Further, the "direction" is a parameter, which determines an arrangement direction of the sequentially assigned numbers starting from the channel area corresponding to the first channel, in either a vertical or horizontal direction. The position of the first channel CH1 according to the "starting point" and the "direction" is shown in FIG. 20. When the "starting point" is set as top left and the "direction" is set as horizontal, an example of such arrangement of the channel numbers is as shown in FIG. 21A. When the "direction" is vertical, an example of such arrangement of the channel numbers is as shown in FIG. 21B. After setting the channel numbers, the "SET" button is pressed to effectuate the setting. (step S15). The set data (channel information) are stored in the memory unit 65 (step S12), as in the arbitrary setting mode described above. The channel information is stored in the data structure where the relative coordinates of the channels are arranged in numerical order of the identification numbers of a plurality of channels, as explained with reference to FIGS. 5A to 5C.

Figures 22, 23:
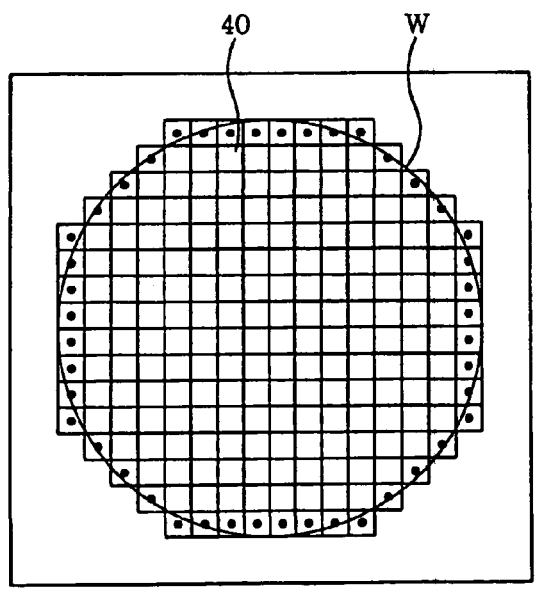
FIG. 22 shows an input screen for setting chip arrangement on a wafer.
FIG. 23 shows a screen displaying a wafer and an array of chips.
Figure 24:
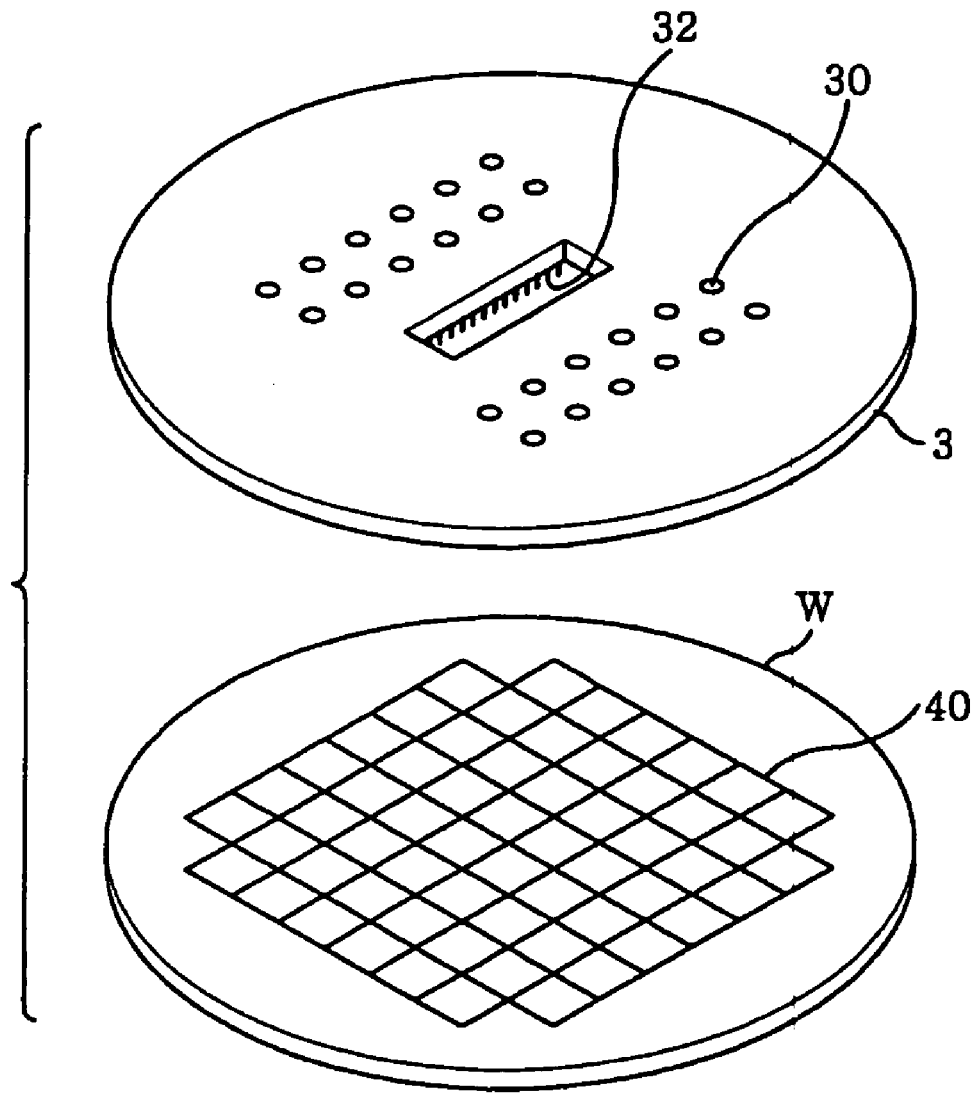
FIG. 24 offers perspective views of a probe card and a wafer in a conventional probe device.

Furthermore, the memory unit 65 can further store the channel information, information on the layout of the chips on the wafer to be inspected, and information on the assignment of the channel contact area to the layout of the chips. The information is created by the program 72 shown in FIG. 13 and, further, a screen illustrated in FIG. 22 appears by, e.g., selecting a dialog for "object selection" from the setting menu in the menu bar. After inputting a chip size, i.e., X- and Y-directional sizes, and selecting a wafer size, a type of an aligning member of the wafer (e.g., an orientation flat or a notch) is selected. In case of the orientation flat, the position thereof is inputted. Since the distance between the neighboring chips is known, the image of the arrangement of the chips can be displayed overlapping the image of the wafer W as shown in FIG. 23 based on the inputted information. The chips disposed inward at a certain distance from the circumference of the wafer W make up the layout of the chips. For example, the position of the coordinates of each chip with respect to the center of the wafer W is stored in the memory unit 65. In FIG. 23, the chips marked with closed dots (●) are the ones not to be inspected. The memory unit 65 in the present embodiment serves both as the channel information memory unit and the chip layout memory unit.

After determining the layout of the chips, the assignment of the channels to the chips (e.g., refer to FIG. 8B) is determined, based on the preset rules. The memory unit 65 stores the data (i.e., relationship between the channels and the chip group) for determining which group of chips among the chips is to be in contact with the four channels (14') of the probe card 3 in the drawing. The assignment can be set arbitrarily by the operator. As described above, when the four channels are in contact with the chips in the second and third rows, the measured area overlaps with the previously measured area. In this case, the information for determining which measured area is to be effective (which measurement result is to be adopted) is stored in the memory unit 65.

In the preferred embodiment, the channel information creation device 300 is a separate computer from the probe device 100, to prevent an increase in the workload of the probe device 100. However, the channel information creation device 300 and the probe device 100 may be implemented as a single unit, in which case the channel information creation program is loaded in the probe device 100.

When such channel information creation device 300 loaded with the channel information creation program 71 creates the channel information, the following effects can be obtained. Channel areas corresponding to the channels are configured in a matrix form and the areas corresponding to the layout of the channels are designated, so that the layout can be set arbitrarily and, further, a complicated shape of layout, e.g., non-rectangular shape, can be designed easily. In the channel areas with the layout, the identification numbers can be inputted through the use of, e.g., the pointing device. The identification numbers can be assigned arbitrarily. Even irregularly arranged identification numbers can be easily assigned. When a probe card having a new layout is fabricated, new software therefor need not be developed. Newly created channel information therefor is sufficient in accommodating the new layout of the probe card, and thus, the time and cost for developing the new software can be reduced.

By differentiating the channel areas with the identification numbers from those without the numbers (e.g., by bordering the channel areas with the identification numbers in a different color), the identification numbers can be assigned easily and, therefore, errors in assigning the identification numbers can be avoided. By allowing to select one of the arbitrary setting mode and the automatic setting mode, the inspection can be performed with greater flexibility. In other words, the "automatic setting mode" can be selected in case of the probe card with regular arrangement of channel identification numbers, whereas the "arbitrary setting mode" can be selected in case of using the probe card with irregular arrangement of channel identification numbers.

According to the preferred embodiments of the present invention, even when the layout of the channels of the probe card or the arrangement of the identification numbers thereof is changed, such change can easily be accommodated.

Other features and modifications can be conceived by those skilled in the art. Therefore, the present invention is not limited to the specific preferred embodiments herein disclosed but should be understood from a wider viewpoint.

Accordingly, in interpreting the concept and scope of the inventions broadly defined in the following claims and their equivalents, various changes and modifications may be made without departing form the spirit and scope of the invention as defined therein.

What is claimed is:

1. A probe device for inspecting electrical characteristics of objects to be inspected by a tester electrically connected to a number of probes of a probe card while the probes are simultaneously in contact with electrode pads of the object formed on a substrate to be inspected, the probe device comprising:

a mounting table on which the substrate is mounted;

a controller for controlling an operation of the probe device;

a supporting member for supporting the probe card including a plurality of channels, wherein each of the channels has a group of probes which are brought into contact with plural electrode pads of one of the objects;

a channel information creation unit for creating channel information including a layout of a group of the plurality of channels and an identification number of each of the channels and transmitting the created channel information to the controller;

a channel information memory unit for storing the channel information received from the channel information creation unit; and an object layout memory unit for storing layout information of the objects formed on the substrate, wherein the controller performs an inspection of the substrate at least based on the channel information stored in the channel information memory unit and the layout information of the objects stored in the object layout memory unit.

2. The probe device of claim 1, wherein the substrate is a semiconductor wafer and the object are integrated circuit chips.

3. The probe device of claim 2, wherein data on channel layout information in the channel information includes one of data in which relative coordinates where each of the channels are matched with the identification number thereof and data in which the relative coordinates where each of the channels is located are arranged in a numerical order of identification numbers.

4. The probe device of claim 2, wherein the controller includes at least one of:

a first program, common to plural kinds of probe cards, for controlling a position of the mounting table in order to bring the probes of the probe card into contact with electrode pads of IC chips, based on channel layout information stored in the channel information memory unit and the layout information of the IC chips stored in the object layout memory unit; and a third program, common to the plural kinds of probe cards, for transmitting to the tester the channel information stored in the channel information memory unit.

5. The probe device of claim 2, further comprising a display unit for displaying an image of an arrangement of the IC chips on the substrate to be inspected, wherein the controller includes a second program, common to plural kinds of probe cards, for displaying inspection results of the IC respective chips received from the tester over the image of the arrangement of the IC chips displayed on the display unit, based on the channel information stored in the channel information memory unit.

6. The probe device of claim 2, further comprising a first imaging unit, movable in X, Y and Z directions, for photographing a tip of a probe, wherein the controller includes one of a fourth program for photographing the tip of the probe by the first imaging unit based on channel layout information stored in the channel information memory unit; and a fifth program for photographing the tip of the probe by the first imaging unit based on the channel layout information stored in the channel information memory unit, and determining a state of the photographed tip of the probe.

7. The probe device of claim 2, further comprising a second imaging unit for photographing contact traces of the probes on the electrode pads of the IC chips, wherein the controller includes one of a sixth program for controlling the position of at least one of the second imaging unit and the mounting table to photograph at least one of the contact traces by the second imaging unit based on the channel information stored in the channel information memory unit; and a seventh program for determining whether said at least one of the contact traces is appropriate, in addition to photographing said at least one of the contact traces.

8. The probe device of claim 2, further comprising a grinding member prepared on the mounting table, wherein the controller includes an eighth program for controlling a position of at least one of the mounting table and the probe card to grind the probes of the probe card by the grinding member based on the channel layout information stored in the channel information memory unit.

9. The probe device of claim 2, wherein the channel information creation unit is a computer disposed outside of the probe device.

10. The probe device of claim 2, wherein the channel information creation unit includes a display unit for displaying a set of channels in a matrix form; and a unit for designating channels corresponding to the layout of the channels in the probe card in use among the channels displayed in the display unit.

11. The probe device of claim 2, wherein the channel information creation unit includes a display unit for displaying the layout of the channels of the probe card in use; and a unit for inputting the identification number of each of the channels in the layout of the channels displayed on the display unit.

12. The probe device of claim 2, wherein the channel information creation unit includes at least one of a unit for automatically assigning the identification number to each of the channels; and a unit for arbitrarily assigning the identification number to each of the channels.

13. A program used when a plurality of IC chips formed on a substrate to be inspected are inspected by a probe card, wherein the probe card has a multiplicity of channels and each of the channels has a number of probes which are brought into contact with a number of electrode pads of each of the IC chips, the program comprising:

a first function of displaying a number of channel areas in a matrix form on a screen of a display unit;

a second function of designating channel areas corresponding to a layout of the channels in the probe card among channel areas displayed in the matrix form;

a third function of displaying the designated channel areas on the display unit;

a fourth function of assigning identification number to channel corresponding to each designated channel area; and a fifth function of creating channel information which is a combination of the channel layout information and an identification number of each channel.

14. The program of claim 13, wherein the fourth function includes at least one of functions of automatically and arbitrarily assigning identification numbers to channel areas sequentially designated among the channel areas displayed on the screen of the display unit.

15. The program of claim 14, wherein the channel information includes one of data in which the relative coordinates where each channel is located are matched with the identification number thereof and data in which the relative coordinates of each channel are arranged in a numerical order of the identification numbers.

16. The program of claim 13, wherein the first function has a function of displaying on the screen of the display unit channel areas with assigned identification numbers and channel areas without assigned identification numbers differently.

17. The program of claim 13, further comprising a function of selecting an automatic setting mode or an arbitrary setting mode for assigning identification numbers to the channels corresponding to the designated channel areas, respectively, wherein in the automatic setting mode, the identification numbers are automatically assigned based on a designation of a channel to be assigned a preset first identification number and a direction of sequentially assigning the identification numbers from that channel, while in the arbitrary setting mode, the identification numbers are arbitrarily assigned to the respective channels corresponding to the channel areas displayed on the screen of the display unit.

18. A device for creating channel information to be used in inspecting electrical characteristics of a plurality of integrated circuits formed on an object to be inspected by using a probe card having a number of channels, wherein each of the channels has plural probes corresponding to a single integrated circuit and the channel information includes information on each channel, the device comprising;

a display unit;

a unit for displaying in a matrix form channel areas representing positions of the channels on the display unit;

a designating unit for designating channel areas corresponding to a layout of the channels of the probe card among the channel areas displayed in the matrix form;

an input unit for inputting identification number to a channel corresponding to each of the designated channel areas; and a unit for creating and storing the channel information, based on layout information of designated channels and identification numbers thereof, the channel information being created by matching the layout information of channels with the channel identification numbers thereof.

19. The device of claim 18, wherein the designating unit for designating the channel areas corresponding to the layout of the channels of the probe card is a pointing device.

* * * * *